(12) United States Patent
Fukuhara et al.

(10) Patent No.: US 8,122,385 B2
(45) Date of Patent: Feb. 21, 2012

(54) MASK PATTERN CORRECTING METHOD

(75) Inventors: Kazuya Fukuhara, Tokyo (JP); Tatsuhiko Higashiki, Fujisawa (JP); Toshiya Kotani, Machida (JP); Satoshi Tanaka, Kawasaki (JP); Takashi Sato, Fujisawa (JP); Akiko Mimotogi, Yokohama (JP); Masaki Satake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 542 days.

(21) Appl. No.: 12/129,167

(22) Filed: May 29, 2008

(65) Prior Publication Data

US 2008/0301621 A1    Dec. 4, 2008

(30) Foreign Application Priority Data

May 31, 2007    (JP) ................. 2007-145828

(51) Int. Cl.
   *G06F 17/50*        (2006.01)
(52) U.S. Cl. .......................... 716/50; 716/53
(58) Field of Classification Search ............. 716/50–53
   See application file for complete search history.

(56) References Cited

U.S. PATENT DOCUMENTS

| | | | |
|---|---|---|---|
| 7,027,143 B1* | 4/2006 | Stokowski et al. | 356/237.2 |
| 7,313,781 B2 | 12/2007 | Asano et al. | |
| 7,353,145 B2* | 4/2008 | Tanaka et al. | 703/2 |
| 7,469,058 B2* | 12/2008 | Latypov et al. | 382/144 |
| 7,512,926 B2* | 3/2009 | Hu et al. | 716/50 |
| 7,703,049 B2* | 4/2010 | Abrams et al. | 716/50 |
| 7,743,359 B2* | 6/2010 | Sezginer et al. | 716/50 |
| 2006/0105249 A1 | 5/2006 | Kushida et al. | |
| 2006/0256315 A1 | 11/2006 | Sato et al. | |
| 2007/0234269 A1 | 10/2007 | Tanaka et al. | |
| 2007/0245292 A1 | 10/2007 | Satake et al. | |
| 2007/0277146 A1 | 11/2007 | Satake et al. | |

FOREIGN PATENT DOCUMENTS

| | | |
|---|---|---|
| JP | 2001-174974 | 6/2001 |
| JP | 2002-008966 | 1/2002 |
| JP | 2002-148779 | 5/2002 |
| JP | 2003-167323 | 6/2003 |
| JP | 2005-141228 | 6/2005 |
| JP | 2006-276260 | 10/2006 |
| JP | 2006-276260 | 12/2006 |

OTHER PUBLICATIONS

T.V. Pistor, "Accuracy Issues in the Finite Difference Time Domain Simulation of Photomask Scattering," Optical Microlithography XIV, C.J. Progler, Ed., Proceedings of SPIE, vol. 4346, pp. 1484-1491 (2001).

Japanese Notice of Reasons for Rejection Mailed Aug. 11, 2009 in Counterpart Application No. 2007-145828 (5 pages including translation).

* cited by examiner

*Primary Examiner* — Jack Chiang
*Assistant Examiner* — Binh C Tat
(74) *Attorney, Agent, or Firm* — Finnegan, Henderson, Farabow, Garrett & Dunner, L.L.P.

(57) ABSTRACT

In a model-based OPC which makes a suitable mask correction for each mask pattern using an optical image intensity simulator, a mask pattern is divided into subregions and the model of optical image intensity simulation is changed according to the contents of the pattern in each subregion. When the minimum dimensions of the mask pattern are smaller than a specific threshold value set near the exposure wavelength, the region is calculated using a high-accuracy model and the other regions are calculated using a high-speed model.

24 Claims, 9 Drawing Sheets

MASK PATTERN CORRECTING METHOD

CROSS-REFERENCE TO RELATED APPLICATIONS

This application is based upon and claims the benefit of priority from prior Japanese Patent Application No. 2007-145828, filed May 31, 2007, the entire contents of which are incorporated herein by reference.

BACKGROUND OF THE INVENTION

1. Field of the Invention

This invention relates to an optical proximity effect correcting method in photolithography, and more particularly to a mask pattern correcting method, which is applied to light exposure using, for example, an exposure device that meets NA>1.

2. Description of the Related Art

When the size of a pattern is larger than the exposure wavelength, a shape can be formed easily on a substrate as designed. Specifically, first, a planar shape of an LSI pattern to be formed on a substrate is drawn directly as a design pattern. Then, a mask pattern faithful to the design pattern is created. Thereafter, the mask pattern is transferred onto a substrate with a projection optical system and the underlying layer is etched, which produces a pattern almost as designed.

However, as the pattern has been miniaturized further, it has been getting difficult to form a pattern shape in faithful accordance with the mask pattern. A disorder in the faithfulness appears as a dimensional difference (roughness dimensional difference) between a region where the pattern period is short (dense region) and a region where the pattern period is long (isolated region). Generally, what is caused by light is referred to as an optical proximity effect (OPE) and what is caused by such a process as development or etching, in addition to light, is all referred to as a process proximity effect (PPE).

To solve an OPE or PPE problem, it is necessary to use a mask pattern differing from the design pattern and make the final finished dimensions and shape equal to the dimensions and shape of the design pattern. That is, a so-called mask data process to create a corrected mask pattern is important.

The mask data process includes an MDP process of changing the shape of the mask pattern using a graphic computation process, a design rule checker (DRC), or the like and an OPC process of correcting the OPE. These processes are performed, thereby correcting the mask pattern suitably so that the final finished dimensions may satisfy the desired requirements. To execute an OPC (optical proximity correction) process with a high accuracy, a model-based OPC method becomes mainstream which calculates a suitable shape correction value for each mask pattern using an optical image intensity simulator capable of accurately predicting the OPE caused by the characteristic of the optical system of the exposure device. The optical image intensity simulator has generally calculated the diffraction of light using a so-called thin-film mask model (also referred to as a Kirchhoff model), approximately considering the pattern of a mask to be not only a two-dimensional object with no thickness but also an ideal object characterized by the transmittance and phase error independent on the incident angle of light.

With the recent development of an immersion exposure device, a device whose projection lens NA exceeds 1 has been developed. Generally, the magnification of a projection lens is kept at ¼ as in the conventional equivalent, thereby trying to realize the miniaturization of the pattern, while keeping the same exposure area as the conventional one.

However, if the magnification of the projection lens is kept, for example, when a pattern with a half pitch of 45 nm is formed with an ArF exposure device (with an exposure wavelength of 193 nm), the half pitch on the mask is 45×4=180 nm. This means that the pattern dimensions on the mask are smaller than the exposure wavelength.

Under such a condition, the thin-film mask model is not a suitable approximation and it is necessary to do a numeric calculation using a Maxwell equation to predict the diffraction of light caused by a mask pattern (e.g., refer to Jpn. Pat. Appln. KOKAI Publication No. 2006-276260). The numeric calculation method includes, for example, a finite domain time difference method (FDTD method) and a rigorous coupled wave analytic method (RCWA method) written in T. V. Pistor, "Accuracy Issues in the Finite Difference Time Domain Simulation of Photomask Scattering," Proc. SPIE Vol. 4346, pp. 1484-1491. In those numeric calculation methods, the thickness of the mask, the incident angle of light, and the optical constants of the object (refractive index and attenuation coefficient) are taken into account. Hereinafter, this is referred to as a 3D mask model in comparison with the thin-film mask model. When the dimensions of the pattern are sufficiently large, the 3D mask model brings the same result as that of the thin-film mask model.

The image intensity is simulated using a computer. The simulation of the image intensity requires a large capacity of memory to calculate a 3D mask model and takes more than a hundred times the time required to calculate a thin-film mask. Therefore, it is not realistic to predict the image density of the entire region of the mask pattern using a 3D mask model.

EUV exposure devices recently developed have an exposure wavelength as short as 13.5 nm. EUV exposure devices used in general have a projection lens whose magnification is ¼, and the value of NA is not more than 1, e.g., 0.25 or so. Although the size of the mask pattern is greater than the wavelength, the use of a reflection type mask inevitably requires oblique illumination, wherein light incident on a mask is inclined 6 to 10 degrees. In this case as well, the influence due to the thickness of the mask pattern is not negligible, so that there may be a case where the use of a 3D mask model is desirable.

BRIEF SUMMARY OF THE INVENTION

According to an aspect of the invention, there is provided a method of correcting a mask pattern which is designed to form a semiconductor integrated circuit and is transferred onto a substrate by light exposure, the method comprising: dividing the mask pattern into a plurality of subregions; determining an optical model to estimate image intensity formed on the substrate from a plurality of optical models on the basis of the relationship between the degree of fineness of the patterns included in each of the subregions and the wavelength of exposure light; and estimating image intensity on the substrate for each of said plurality of subregions using the determined optical model.

According to another aspect of the invention, there is provided a method of correcting a mask pattern which is designed to form a semiconductor integrated circuit and is transferred onto a substrate by light exposure, the method comprising: dividing the mask pattern into a plurality of subregions; selecting an optical model to estimate image intensity formed on the substrate from a plurality of optical models differing in accuracy and speed on the basis of the relationship between the smallest size of the patterns included in each of the subregions and the wavelength of exposure light; and estimating image intensity on the substrate for each of said plurality of subregions using the selected optical model, wherein, when the smallest size of the patterns included in the subregions is smaller than a specific threshold value, a high-accuracy optical model is selected and, when the smallest size is larger than the specific threshold value, a high-speed optical model is selected.

According to still another aspect of the invention, there is provided a method of correcting a mask pattern which is designed to form a semiconductor integrated circuit and is transferred onto a substrate by light exposure, the method comprising: dividing the mask pattern into a plurality of subregions; selecting a first optical model featuring high accuracy for a subregion where the value obtained by dividing the smallest size of the patterns included in each of the subregions by the wavelength of exposure light is smaller than a specified value and selecting a second optical model featuring high speed for a subregion where the value obtained is equal to or larger than the specified value; and estimating image intensity for each of said plurality of subregions using the selected first or second optical model.

DETAILED DESCRIPTION OF THE INVENTION

First Embodiment

Figure 1:
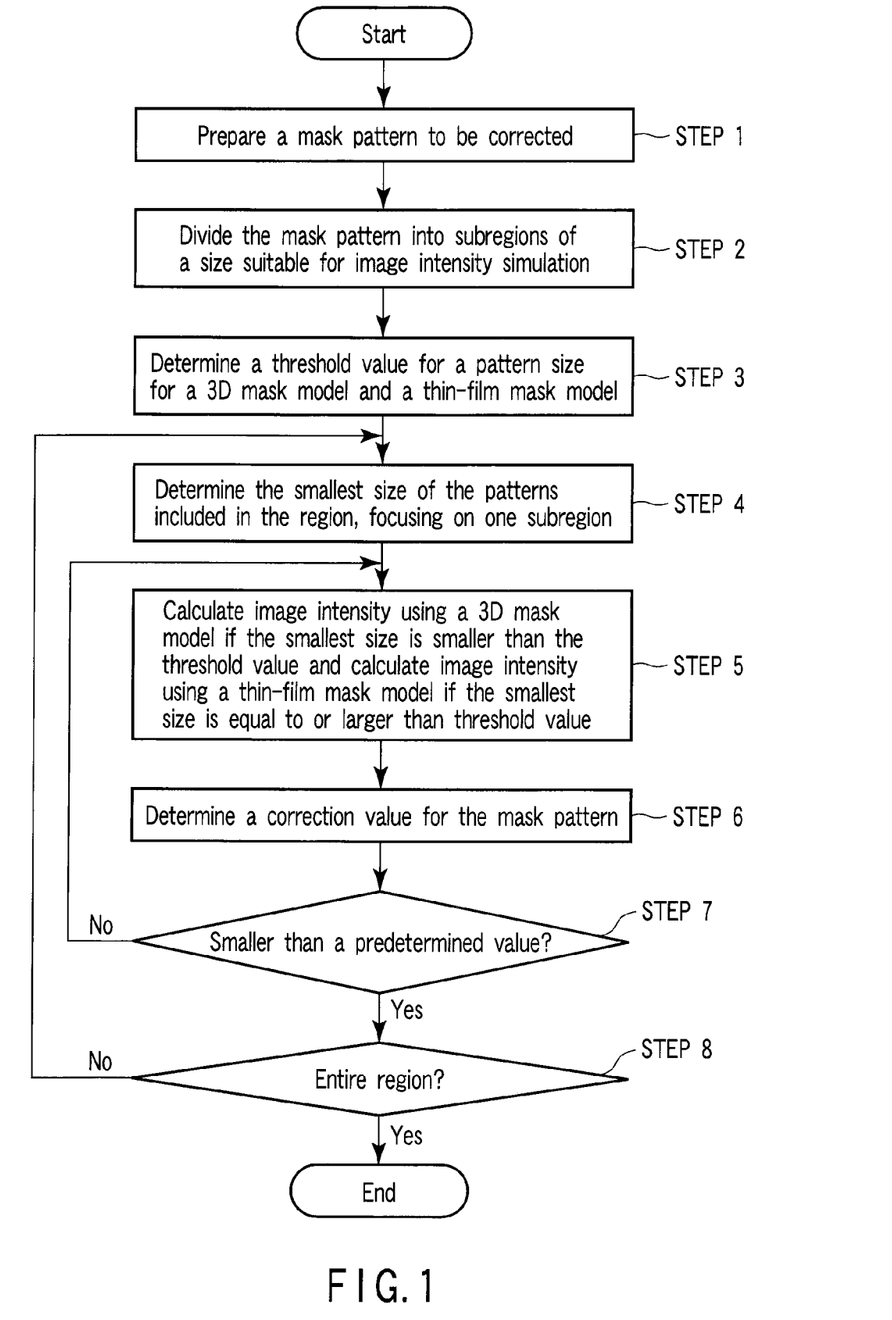
FIG. 1 is a flowchart to help explain a light proximity effect correcting method according to a first embodiment of the invention.
Figure 2:
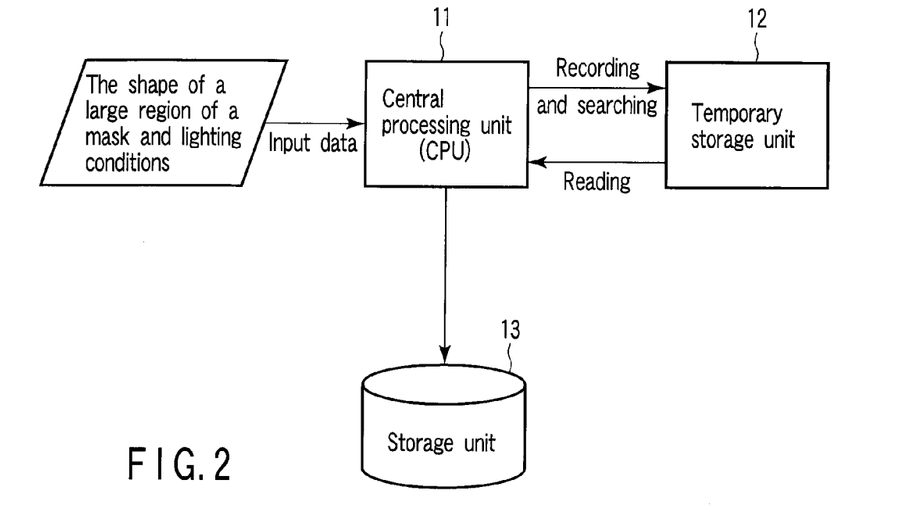
FIG. 2 schematically shows the configuration of the main part of an optical image intensity simulator to which the light proximity effect correcting method of the first embodiment is applied.
Figure 3:
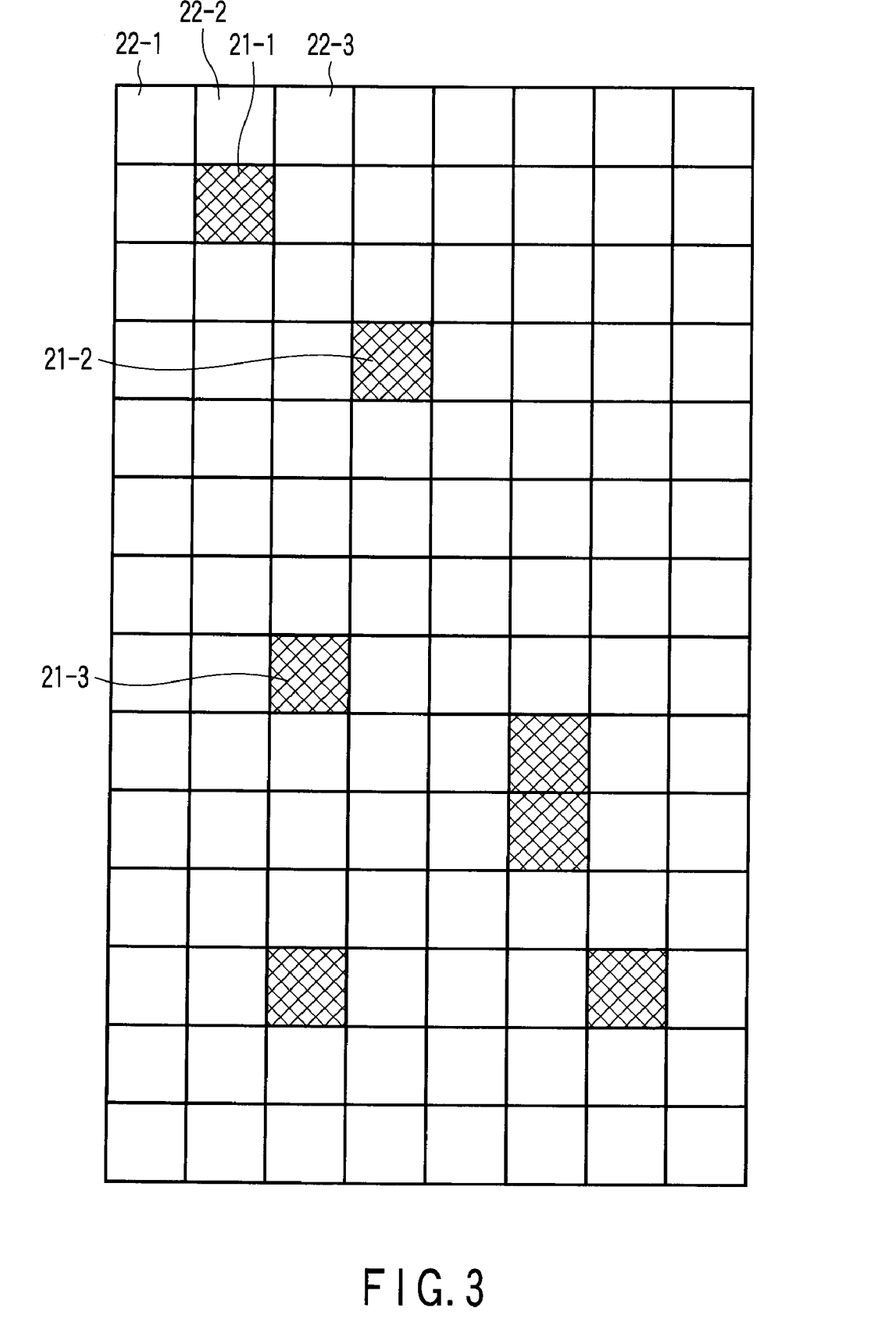
FIG. 3 is a plan view to help explain the relationship between a layout pattern and an optical model to be applied.

FIG. 1 is a flowchart to help explain a mask pattern correcting method according to a first embodiment of the invention. FIG. 2 schematically shows the configuration of the main part of an optical image intensity simulator to which the correcting method is applied. FIG. 3 is a plan view to help explain the relationship between a layout pattern and an optical model to be applied. A layout pattern (not shown) is designed to form a semiconductor integrate circuit and is transferred onto a substrate by light exposure.

The mask pattern correcting method of the first embodiment is to switch between a high-accuracy optical model (a first optical model) and a high-speed optical model (a second optical model) according to the degree of fineness of a pattern, for example, the smallest size. Specifically, a pattern size serving as a threshold value is specified in advance. If a pattern smaller than the pattern size is included in an image intensity calculation region, a calculation is made with a high-accuracy 3D mask model. If the pattern is not included in the region, a calculation is done with a high-speed thin-film model. The threshold value may be specified arbitrarily by the user or be determined by a program from a specified exposure wavelength. As a preferable threshold value, the dimensions of a pattern on the mask are in the range from $\lambda$ to $2\lambda$. The values other than these may be used according to the predicted accuracy or calculation time needed.

Next, the processing procedure for an OPC method of switching between a 3D mask model and a thin-film mask model according to the degree of fineness of the pattern will be explained in detail.

As shown in the flowchart of FIG. 1, first, a mask pattern to be corrected is prepared (STEP 1).

Next, data, including the shape of a large region of a mask and lighting conditions, are input to an optical image intensity simulator as shown in FIG. 2. These input data are processed at a central processing unit (CPU) 11, which divides the mask pattern into subregions (small regions) of a size (e.g., 5 μm×5 μm) suitable for image intensity simulation as shown in FIG. 3 (STEP 2).

Thereafter, on the basis of the input data, the central processing unit (CPU) 11 determines a threshold value for the pattern size of the 3D mask model and thin-film mask model. The threshold value may be specified arbitrarily by the user. Here, the threshold value is determined by a program on the basis of a specified exposure wavelength. For example, since an ArF exposure device has an exposure wavelength $\lambda$ of 193 nm, the threshold value of the pattern size on the mask is set to 193 nm, the same as $\lambda$ (STEP 3).

Next, focusing on one subregion, the smallest size of the patterns included in the subregion is determined (STEP 4).

Then, whether image intensity is calculated using the 3D mask model or thin-film mask model is determined, depending on whether or not the value obtained by dividing the smallest size of the patterns included in the subregion by the wavelength of the exposure light is smaller than a specified value (e.g., 1). The result of the determination is recorded in a temporary storage unit 12. If the smallest size is smaller than the threshold value of the pattern size on the mask, image intensity is calculated using the 3D mask model. If the smallest size is equal to or larger than the threshold value, image intensity is calculated using the thin-film mask model (STEP 5). In FIG. 3, mesh regions 21-1, 21-2, 21-3, . . . are 3D mask model computing regions and blank regions 22-1, 22-2, 22-3, . . . are thin-film mask model computing regions.

Next, using an "image intensity slice level" determined from a specific reference pattern, the shape of a pattern formed on the substrate is found. The shape is compared with a target pattern shape and a mask pattern correction value is so determined that the difference between the shapes becomes smaller (STEP 6). STEP 5 and STEP 6 are repeated as needed. This process is repeated until, for example, the difference becomes smaller than a predetermined value. The image obtained as a result of the processing is stored in a storage unit 13.

Thereafter, the mask information stored in the temporary storage unit 12 is searched for and the mask information included in each subregion is read out sequentially. Then, the processes in STEP 4 to STEP 7 are applied to the entire region of the mask pattern and the resulting data are stored in the storage unit 13, which completes the process (STEP 8).

The processes in STEP 1 to STEP 8 are performed, which enables a suitable OPC to be made to the entire region of the mask pattern.

As described above, a thin-film mask model capable of high-speed processing is used for a subregion requiring no high accuracy and a 3D mask model is selectively used for a region requiring high accuracy, which enables an image of a mask pattern of a large region to be calculated at high speed with high accuracy. This makes it possible not only to reduce the OPC load but also manufacture a high-accuracy mask, while suppressing an increase in the mask manufacturing cost and in the manufacturing time, and therefore increase the yield of semiconductor devices sufficiently.

Second Embodiment

In the first embodiment, from the smallest size of the patterns included in each subregion, an image intensity computing model for the subregion has been determined. However, for example, when a subregion has been calculated using a 3D mask model and its adjacent subregion has been calculated using a thin-film mask model, there might arise a problem: for example, the pattern edges do not coincide with one another at the junctions of the regions. It is conceivable that a change in the diffraction of light (from the thin-film model) due to the presence of a micropattern influences as far as the edges of the size of the region (5 μm×5 μm). In such a case, a 3D mask model has to be used all the way to a place sufficiently away from where the micropattern exists. To cope with this problem, the processing procedure is modified as shown in FIG. 4.

Figure 4:
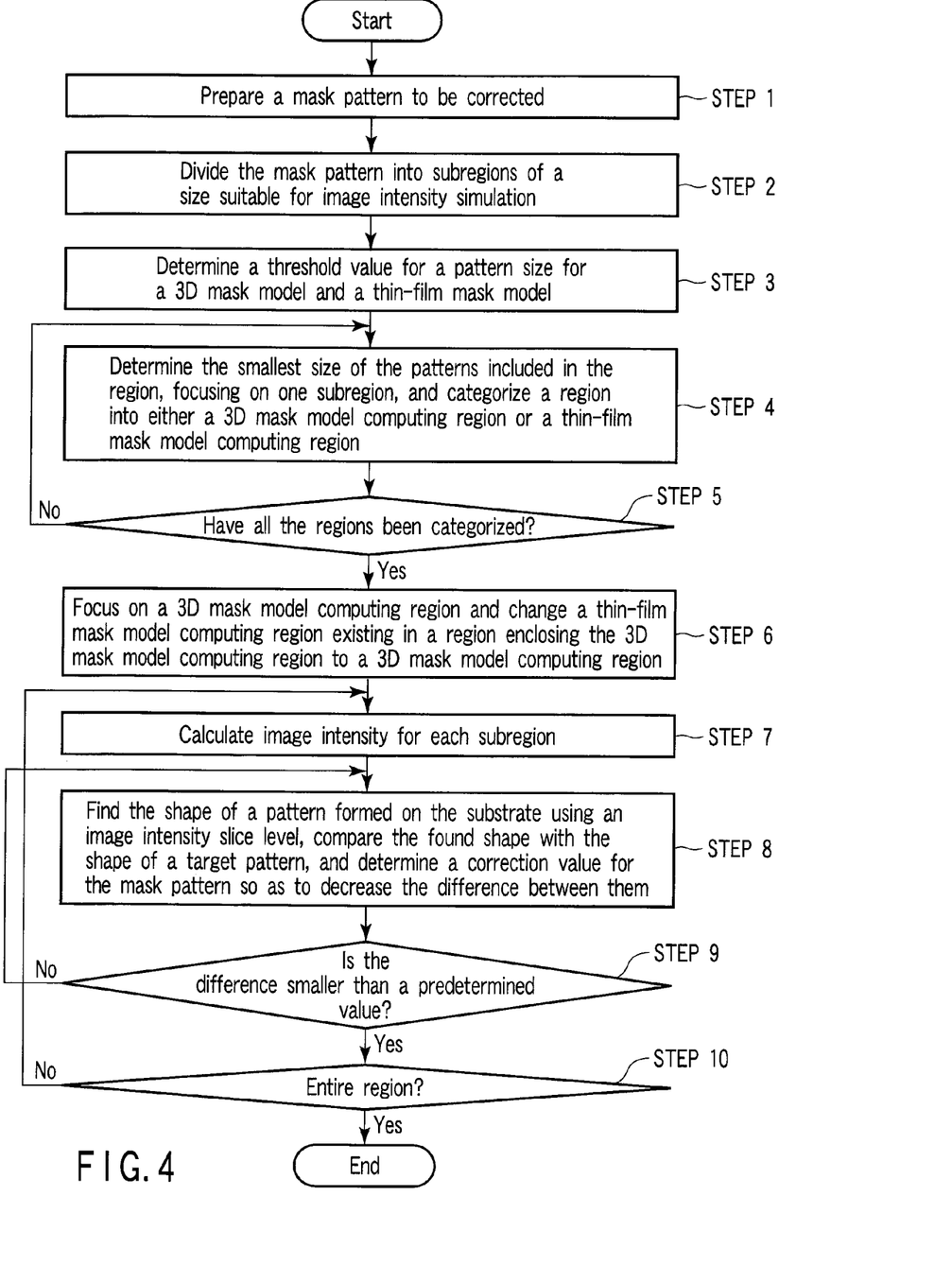
FIG. 4 is a flowchart to help explain a light proximity effect correcting method according to a second embodiment of the invention.
Figure 5:
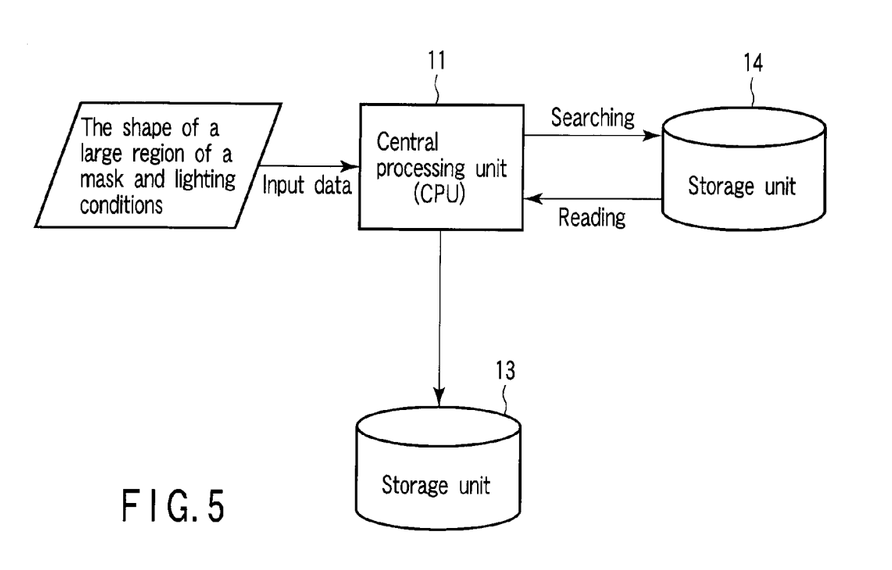
FIG. 5 schematically shows the configuration of the main part of an optical image intensity simulator to which the light proximity effect correcting method of the second embodiment is applied.
Figure 6:
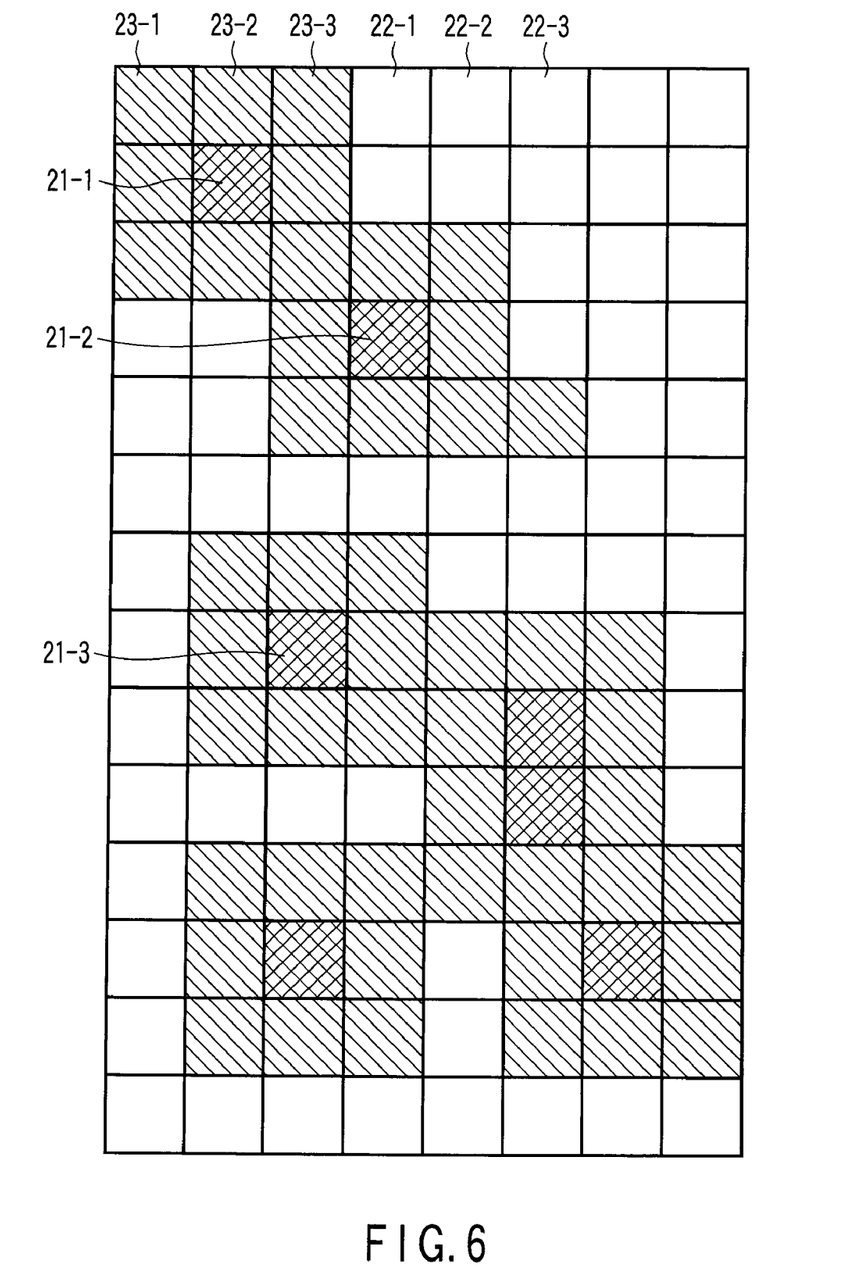
FIG. 6 is a plan view to help explain the relationship between a layout pattern and an optical model to be applied.

FIG. 4 is a flowchart to help explain a mask pattern correcting method according to a second embodiment of the invention. FIG. 5 schematically shows the configuration of the main part of an optical image intensity simulator to which the correcting method of the second embodiment is applied. FIG. 6 is a plan view to help explain the relationship between a layout pattern and an optical model to be applied. A layout pattern (not shown) is designed to form a semiconductor integrate circuit and is transferred onto a substrate by light exposure.

As shown in the flowchart of FIG. 4, first, a mask pattern to be corrected is prepared (STEP 1).

Next, data, including the shape of a large region of a mask and lighting conditions, are input to an optical image intensity simulator as shown in FIG. 5. These input data are processed at a central processing unit (CPU) 11, which divides the mask pattern into subregions (small regions) of a size (e.g., 5 μm×5 μm) suitable for image intensity simulation as shown in FIG. 6 (STEP 2).

Thereafter, on the basis of the input data, the central processing unit (CPU) 11 determines the threshold value (e.g., 193 nm equal to the exposure wavelength λ) of a pattern size for a 3D mask model and a thin-film mask model (STEP 3). The threshold value may be specified arbitrarily by the user or may be determined by a program on the basis of a specified exposure wavelength.

Next, focusing on one subregion, the smallest size of the patterns included in the subregion is determined. Its region is categorized into any one of a 3D mask model computing region and a thin-film mask model computing region and then is recorded in a storage unit 14 (STEP 4). In FIG. 6, mesh regions 21-1, 21-2, 21-3, . . . are 3D mask model computing regions.

STEP 4 is performed on each of the subregions. All the regions are categorized and then recorded into the storage unit 14 (STEP 5).

Next, focusing on the mesh regions 21-1, 21-2, 21-3, . . . , a thin-film mask model computing region existing in a specific region enclosing these subregions is changed to a 3D mask model computing region (STEP 6). That is, information about the 3D mask model computing region and thin-film mask model computing region recorded in the storage unit 14 is read out. A subregion which has selected the thin-film mask model is changed to a 3D mask model within a specified distance from a subregion which has selected a 3D mask model. The resulting mask model is recorded into the storage unit 14 again. In FIG. 6, hatched regions 23-1, 23-2, 23-3, . . . are 3D mask model computing regions and blank regions 22-1, 22-2, 22-3, . . . are thin-film mask model computing regions. In this example, the thin-film mask model computing region arranged so as to enclose the 3D mask model computing regions 21-1, 21-2, 21-3, . . . has been changed to a 3D mask model computing region.

Thereafter, the optical model recorded in the storage unit 14 is searched for and read out. Then, image intensity is calculated for each subregion and the result is recorded into the storage unit 13 (STEP 7).

Next, using an image intensity slice level determined from a specific reference pattern, the shape of a pattern formed on the substrate is found. The shape is compared with the shape of a target pattern and a correction value for the mask pattern is so determined that the difference between the shapes become smaller (STEP 8). STEP 8 is repeated as needed. For example, STEP 8 is repeated until the difference becomes smaller than a predetermined value (STEP 9).

Then, STEP 7, STEP 8, and STEP 9 are performed on the entire region of the mask pattern, which completes the process (STEP 10).

The processes in STEP 1 to STEP 10 are performed, enabling the pattern edges at the junctions of the 3D mask model and thin-film mask model to coincide with one another, which enables a suitable OPC to be made to the entire region of the mask pattern.

In the second embodiment, since a thin-film mask model capable of high-speed processing is used for a subregion requiring no high accuracy and a 3D mask model is used for a region requiring high accuracy and the junctions, which enables an image of a mask pattern of a large region to be calculated at high speed with high accuracy. This makes it possible not only to reduce the OPC load but also manufacture a high-accuracy mask, while suppressing an increase in the mask manufacturing cost and in the manufacturing time, and therefore increase the yield of semiconductor devices sufficiently.

Third Embodiment

Figure 7:
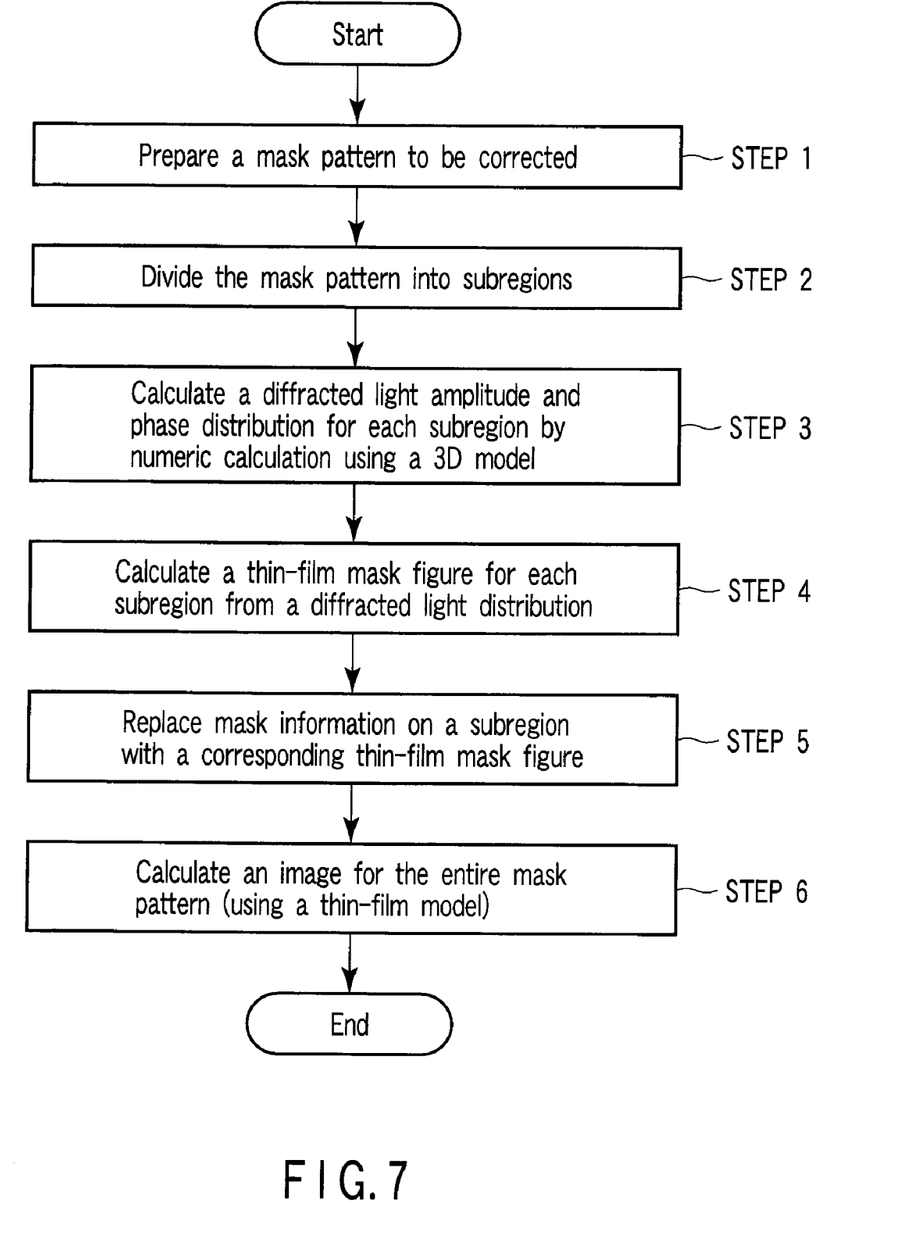
FIG. 7 is a flowchart to help explain a light proximity effect correcting method according to a third embodiment of the invention.
Figure 8:
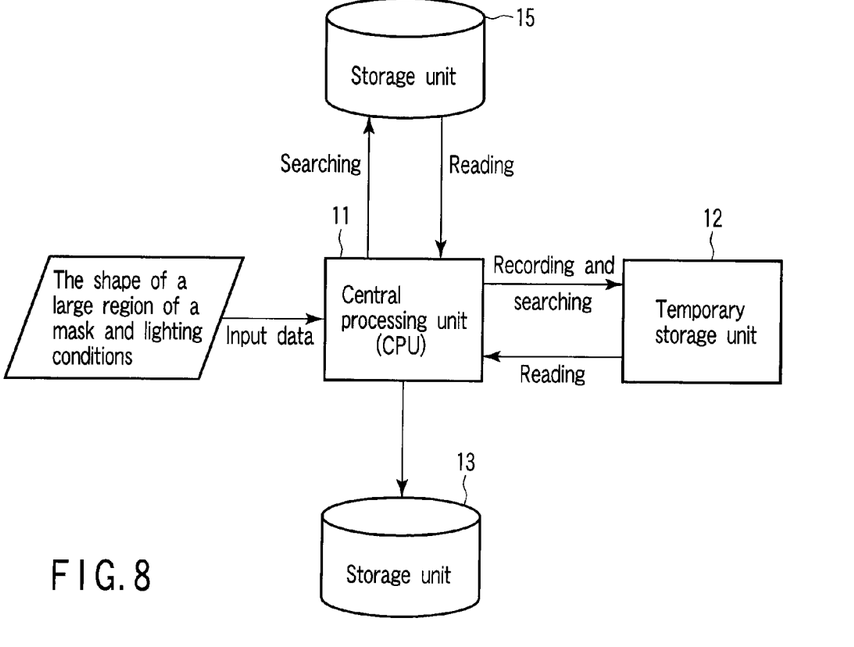
FIG. 8 schematically shows the configuration of the main part of an optical image intensity simulator to which the light proximity effect correcting method of the third embodiment is applied.

FIG. 7 is a flowchart to help explain a mask pattern correcting method according to a third embodiment of the invention. FIG. 8 schematically shows the configuration of the main part of an optical image intensity simulator to which the correcting method is applied.

The mask pattern correcting method of the third embodiment is such that a mask pattern is divided into a plurality of subregions, regions needing calculations with a 3D mask model are extracted, and a thin-film mask model is found whose diffracted light distribution at the pupil of the projection lens for a simple pattern in the regions is equivalent to the calculation result using the 3D mask model of the original pattern. That is, in the case of a simple pattern, the 3D mask model is replaced with a thin-film mask model. In the replacement, a mask bias, a shading part transmittance, a shading part phase difference, a transmitting part transmittance, and others are calculated, taking into account the dependence of illumination light on the incident angle. Data for these conversions are stored in a substitution table beforehand. In 3D calculations using an arbitrary pattern, a 3D mask model is converted into a thin-film mask model using the data held in the substitution table. Then, the resulting mask model is replaced with the original mask pattern. Using the thin-film mask model for the entire mask pattern, an image at the substrate surface is calculated.

Next, a detailed explanation will be given about the processing procedure for an OPC method of making the calculation result using the thin-film mask model equivalent to the calculation result using the 3D mask model.

As shown in the flowchart of FIG. 7, first, a mask pattern to be corrected is prepared (STEP 1).

Next, data, including the shape of a large region of a mask and lighting conditions, are input to an optical image intensity simulator as shown in FIG. 8. These input data are processed at a central processing unit (CPU) 11, which divides the mask pattern into subregions of a size (e.g., a 5 μm×5 μm image calculation region) suitable for image intensity simulation (STEP 2).

Next, mask information and calculation model information about the image calculation region is read from the temporary storage unit 12 and a diffracted light amplitude and phase distribution are calculated for each subregion by numeric computation using a 3D mask model (STEP 3).

Figure 9A:
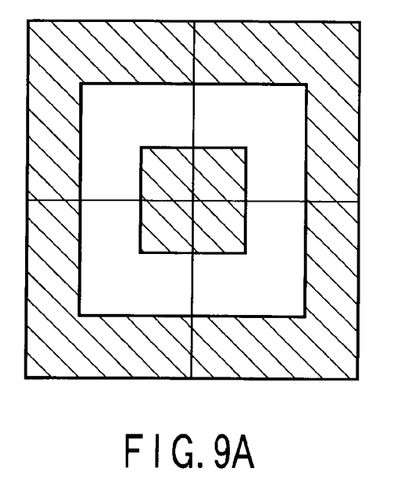
FIGS. 9A to 9D are pattern plan views to help explain the steps of replacing mask information on the subregions of a 3D mask model with corresponding thin-film mask figures.
Figure 9B:
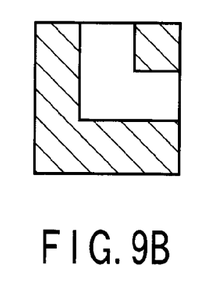
Figure 9C:
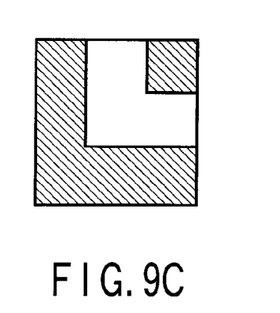
Figure 9D:
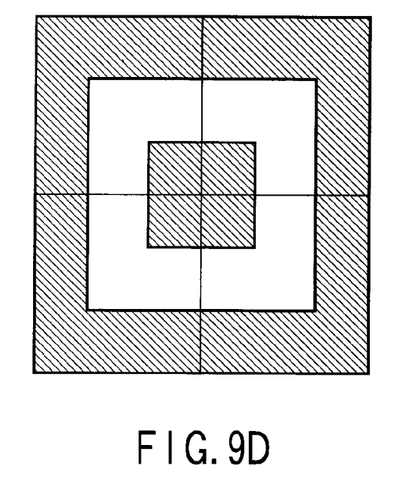

Then, a thin-film mask figure is calculated for each subregion from a diffracted light distribution (STEP 4). The thin-film mask figure is represented by data, such as a mask bias, a shading part amplitude, a transmitting part amplitude, or a phase difference. As shown in FIG. 9A, the thin-film mask figure is such that a subregion for making numeric computations using a 3D mask model is further divided into smaller cells (sub-cells) represented by a thin-film mask model as shown in FIG. 9B. The sub-cell is represented by a thin-film mask model equivalent to the calculation result using a 3D mask model as shown by FIG. 9C. The sub-cells are arranged as shown in FIG. 9D, thereby representing the subregion by a thin-film mask model composed of a plurality of (here, four) sub-cells.

In this way, mask information about the subregion is replaced with a corresponding thin-film mask figure (STEP 5). At this time, the 3D mask and the thin-film mask replacement information previously acquired and stored in a storage unit (replacement table) 15 are searched for and read out. Then, calculations are made to find an image for the 3D model region at the central processing unit 11. The image obtained as a result of the calculation is stored in the storage unit 13.

In this way, an image for the entire mask pattern is calculated using the thin-film model (STEP 6).

Specifically, the third embodiment is such that calculations are done, replacing a 3D mask model with a virtual thin-film mask model. The virtual thin-film mask model is stored in the replacement table (storage unit 15) beforehand. The replacement information in the table is read and used, thereby shortening the calculation time.

Next, an explanation will be given about an image estimation method of replacing a 3D mask model with a virtual thin-film mask model, or obtaining the calculation result using a thin-film mask model equivalent to the calculation result using a 3D mask model.

Figure 10A:
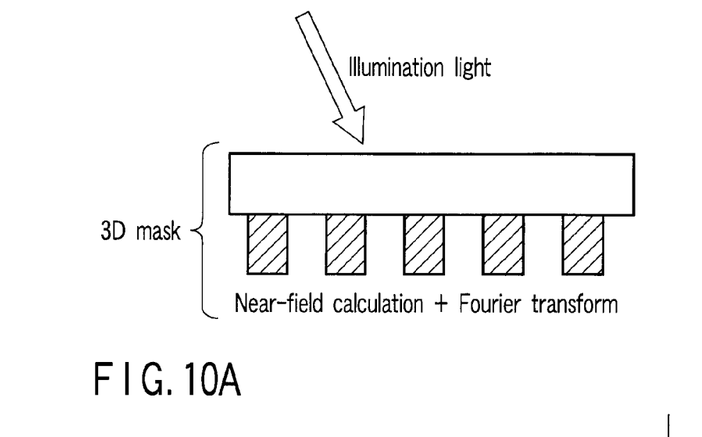
FIG. 10A is a side view which shows the relationship between illumination light and a mask and which helps explain the replacement of a 3D mask model with a virtual thin-film mask model.

As shown in FIG. 10A, when a line-and-space pattern (hereinafter, referred to as an L/S) with a half pitch equal to or less than the exposure wavelength on which a mask has been formed is exposed, the pattern is illuminated by oblique incidence as shown by an arrow. Of the diffracted light developed at the mask pattern, "zero-order diffracted light," the direct advance component and "first-order diffracted light" advancing in a curve, that is, two diffracted lights, are taken in by the projection lens, which forms an image on the substrate. The characteristics of the diffracted light from the mask pattern at the pupil of the projection lens can be explained as:

(1) The amplitude of zero-order diffracted light (2) The amplitude of first-order diffracted light (3) The phase difference between zero-order and first-order diffracted lights In the case of a fine pattern, these are determined by near-field calculations and Fourier transform using a 3D mask model. On the other hand, a thin-film mask pattern which emits diffracted light having the same characteristics can be defined by a complex amplitude distribution (amplitude, phase).

Figure 10B:
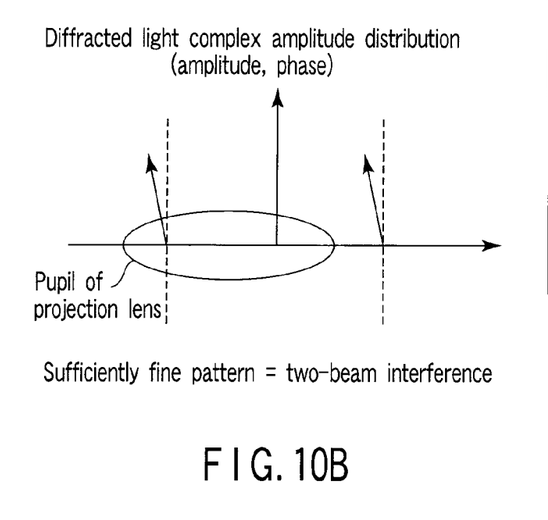
FIG. 10B is a conceptual diagram of two-beam interference to help explain the replacement of a 3D mask model with a virtual thin-film mask model.

It is desirable that the thin-film mask pattern should be represented optically by two layers (such as a transmitting part and a shading part). This is possible in the case of two-beam interference. The thin-film mask pattern is expressed as follows (see FIG. 10B). In FIG. 10B, only light reaching the inside of a circle representing the pupil of the projection lens is taken in by the projection lens. If the pitch of the mask pattern is p, the transmitting part transmittance is a, the shading part transmittance is b, the shading part phase difference with respect to the transmitting part is $\phi$, and the width of the transmitting part is x, the complex amplitudes ($A_0$, $A_1$) of zero-order diffracted light and first-order diffracted light are expressed by the following equations:

$$A_0 = abe^{i\phi} + a(1-be^{i\phi})\frac{x}{p} = a\beta + ab(1-\beta)e^{i\phi}$$

$$A_1 = a(1-be^{i\phi})\frac{t}{p}\text{sinc}\left(\frac{t}{p}\right) = a\beta\text{sinc}\left(\frac{t}{p}\right) - ab\beta\text{sinc}\left(\frac{t}{p}\right)e^{i\phi}$$

where $\beta=x/p$ and i is an imaginary unit.

Accordingly, zero-order diffracted light intensity $A_0^2$ is expressed as:

$$A_0^2 = a^2\beta^2 + a^2b^2(1-\beta)^2 + 2a^2b\beta(1-\beta)\cos\phi$$

First-order diffracted light intensity $A_1^2$ is expressed as:

$$A_1^2 = a^2\beta^2(\mathrm{sinc}\beta)^2 + a^2 b^2 \beta^2(\mathrm{sinc}\beta)^2 - 2a^2 b \beta^2(\mathrm{sinc}\beta)^2 \cos\phi$$

The phase difference between diffracted lights =

$$-i\left[\ln\left(\frac{A_1}{|A_1|}\right) - \ln\left(\frac{A_0}{|A_0|}\right)\right]$$

From the above equations, the parameters a, b, φ, and x representing the characteristics of the mask pattern can be determined on the basis of the zero-order diffracted light intensity, first-order diffracted light intensity, and the phase difference between diffracted lights.

Figure 10C:
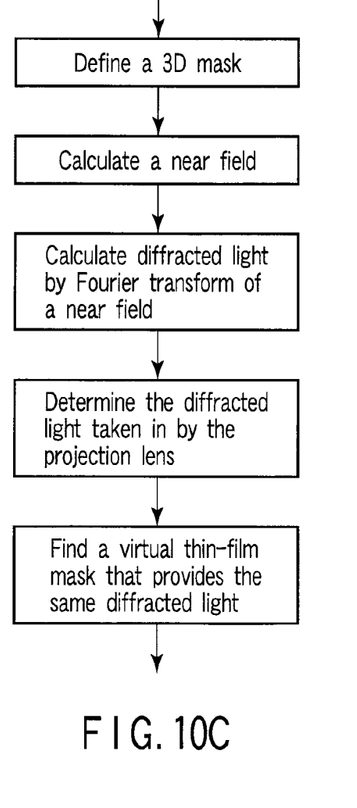
FIG. 10C is a flowchart to help explain the procedure for replacing a 3D mask model with a virtual thin-film mask model.

As described above, an actual 3D mask model can be replaced with a virtual thin-film mask model. FIG. 10C is a flowchart to help explain the above procedure.

The mask models cannot be replaced exactly when three or more beams are taken in by the projection lens. The reason is that, when, for example, zero-order light and first-order light exist, since the characteristics have to be expressed by at least the following five parameters, the zero-order diffracted light intensity, +first-order diffracted light intensity, −first-order diffracted light intensity, the phase difference between the zero order and +first order, and the phase difference between the zero order and −first order, all of the characteristics cannot be expressed using the 2-layer thin-film mask in the above example.

In this case, however, since the pitch of the pattern is sufficiently sparse, 3D mask calculations are not necessarily needed and information about the transmittance and phase of the 3D mask may be used directly as the characteristics of the thin-film mask. The above analytical calculation method cannot be used for a two-dimensional pattern (e.g., a hole shape), not a simple one-dimensional pattern (L/S). In this case, the characteristics of the shape of the thin-film mask have to be expressed using parameters (e.g., the transmitting part transmittance, the shading part transmittance, the phase difference between the transmitting part and shading part, the height of the hole, and the breadth of the hole) and calculations have to be made to optimize the parameters so as to best reproduce the situation of the diffracted light obtained by 3D calculations. It should be noted that a thin-film mask having a three or more layers may be used for the expression of characteristics.

Similarly, in a slit pattern whose width is almost equal to or less than the exposure wavelength, 3D mask calculations may be needed. In this case, since diffracted lights develop consecutively (innumerably), such a thin-film mask as reproduces the distribution function of diffracted light intensity and phase has to be calculated. In the case of a slit pattern, a thin-film mask which gives the closest diffracted light distribution function can be found by changing the slit width on the mask.

As is well known, in the case of 3D mask model calculations, the state of the calculated diffracted light changes according to the incident angle of illumination or depending on the polarized state of illumination light. Accordingly, when illumination light is shed at a plurality of incident angles, a separate thin-film mask is determined for each of the incident angles. Moreover, a separate thin-film mask is determined for each of the types of polarization (p polarization and s polarization). As for the incident angle, the correspondence of a 3D mask to a thin-film mask may be determined by the sampling of incident angles and interpolation or extrapolation in a range that achieves the accuracy needed by the user (specifically, when a thin-film mask is determined for each of incident angle θ1 and incident angle θ2, a suitable method can be used. For example, a thin-film mask of an intermediate shape is used at an intermediate angle between incident angles θ1 and θ2, or the thin-film mask closer to either incident angle θ1 or θ2 is used).

To use the above replacement method in actual image estimation, the items described below have to be followed:

(i) A figure representing a mask pattern composed of a transmitting part and a shading part and lighting conditions are determined.

Figure 11:
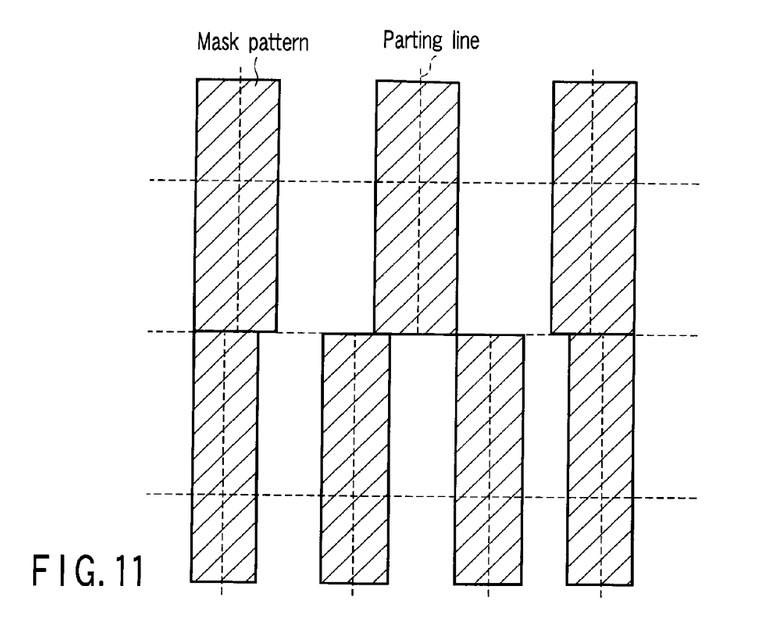
FIG. 11 is a pattern plan view to help explain the division of a mask pattern region to apply a method of replacing a 3D mask model with a virtual mask model to actual image estimation.

(ii) The mask pattern region is divided into finer subregions as shown in FIG. 11.

At this time, it is desirable that the parting lines should be present within the shading part. It is more desirable that the parting lines should be present at equal distances from a plurality of edges of the shading part (in other words, when the shading part looks like a belt, a parting line should coincide with the center line of the belt). For convenience of calculation (Fourier transform) of a diffracted light distribution, a subregion has to be divided into rectangles. As a result, a parting line might exist on the transmitting part.

(iii) A 3D mask is replaced with a thin-film mask for each of the subregions. The conversion of typical sub-cells is stored in the storage unit 15 in the form of a library. When the same sub-cell as a pattern included in the library is converted, the sub-cell is converted directly without using diffracted light, which enables the computing time to be shortened.

Moreover, assuming that the sub-cells satisfy the periodical boundary condition, diffracted light is calculated for the mask. If the periodical boundary condition is not satisfied because the transmitting part of the mask pattern overlaps with the edge of the subregion, a pattern region obtained by inverting the original pattern is placed in an adjacent position at left or right or above or below as shown in FIGS. 9A to 9D, thereby enabling the periodical boundary condition to be fulfilled.

(iV) Using the mask pattern (FIG. 11) obtained by the replacement, an image formed on the substrate is determined from the thin-film mask model. At this time, it should be noted that the mask pattern is not a conventional thin-film mask, but depends on the incident angle of light and the polarized state of incident light.

Therefore, according to the third embodiment, by reducing the number of precise mask 3D calculations, the time required for OPC can be suppressed, while keeping the accuracy of OPC.

Fourth Embodiment

For example, an EUV exposure device selectively uses a 3D mask model and a thin-film mask model in accordance with the dimensional accuracy required of a pattern. Let us assume that the calculated dimensional difference between the thin-film mask model and the 3D mask model is 6 nm in a pattern having the same dimensions as a pattern of interest. In this case, where the dimensional accuracy required of the pattern of interest is higher than ±6 nm (the range is 12 nm), the 3D mask model is used; where the dimensional accuracy is lower than ±6 nm, the thin-mask model is used.

In the fourth embodiment, a threshold value is determined in accordance with the dimensional accuracy required of a pattern of interest, not in accordance with the range of the threshold value used for model determination (whether the size of the pattern on a mask is in the range of λ to 2λ). Since the wavelength of EUV exposure devices is as short as 13.5 nm, it is not likely that the size of the mask pattern is less than the value twice that wavelength. However, light is incident on the mask at an inclined angle of 6 to 10 degrees (oblique illumination). Where the required dimensional accuracy is lower than the threshold value described above, dimensional prediction based on the 3D mask model is required.

As described above, according to a first aspect of the invention, there is provided an optical proximity effect correcting method for a mask pattern which is transferred onto a substrate by light exposure and is designed to be a semiconductor integrated circuit, the optical proximity effect correcting method comprising a step of dividing the mask pattern into a plurality of subregions, a step of determining an optical model to estimate image intensity formed on the substrate on the basis of the relationship between the kinds of patterns included in the subregions and the wavelength of the exposure light, and a step of estimating image intensity on the substrate for each of said plurality of subregions using the determined optical model.

Moreover, according to a second aspect of the invention, there is provided an optical proximity effect correcting method for a mask pattern which is transferred onto a substrate by light exposure and is designed to be a semiconductor integrated circuit, the optical proximity effect correcting method comprising a step of dividing the mask pattern into a plurality of subregions, a step of determining an optical model to estimate image intensity formed on the substrate on the basis of the relationship between the smallest size of the patterns included in the subregions and the wavelength of the exposure light, and a step of estimating image intensity on the substrate for each of said plurality of subregions using the determined optical model.

Furthermore, according to a third aspect of the invention, there is provided an optical proximity effect correcting method for a mask pattern which is transferred onto a substrate by light exposure and is designed to be a semiconductor integrated circuit, the optical proximity effect correcting method comprising a step of dividing the mask pattern into a plurality of subregions, a step of determining an optical model to estimate image intensity formed on the substrate on the basis of the relationship between the smallest size of the patterns included in the subregions and the wavelength of the exposure light and of applying a first optical model to a subregion where the value obtained by dividing the smallest size of the patterns by the wavelength of the exposure light is smaller than a specified value and applying a second optical model to a subregion where the value obtained is equal to or larger than the specified value, and a step of estimating image intensity for each of said plurality of subregions using the determined optical model.

In the above methods, preferable modes are as follows:

(a) The method further comprises, before the step of selecting the optical model and after the step of estimating the image intensity, a step of changing a subregion to which the second optical model is applied to a subregion to which the first optical model is applied within a specified distance from a subregion to which the first optical model is applied.

(b) The first optical model is a model taking into account the influence of the thickness of the mask in estimating the diffraction of light on the mask.

(c) The first optical model is a model taking into account a change in the diffracted light depending on the incident angle of light in estimating the diffraction of light on the mask.

(d) A photomask is formed using the optical proximity effect correcting method and a semiconductor device is manufactured using the photomask in an exposure process.

According to a fourth aspect of the invention, there is provided a method of estimating an image formed by shedding light onto a mask pattern and projecting diffracted light from the mask pattern onto a substrate via a projection lens, the method comprising a step of dividing the mask pattern into a plurality of subregions, a step of calculating a near field formed in the vicinity of the mask by light emitted from first subregions included in said plurality of subregions, a step of replacing the near field with a figure group composed of a plurality of figures having complex amplitude transmittance characteristics, and a step of replacing the first subregion with the corresponding figure group.

According to a fifth aspect of the invention, there is provided a method of estimating an image formed by shedding light onto a mask pattern and projecting diffracted light from the mask pattern onto a substrate via a projection lens, the method comprising a step of dividing the mask pattern into a plurality of subregions, a step of calculating a near field formed in the vicinity of the mask by light emitted from first subregions included in said plurality of subregions, a step of calculating diffracted light at the pupil of the projection lens using the near field, a step of calculating from the diffracted light a figure group composed of a plurality of figures having complex amplitude transmittance arranged at the surface of the mask pattern, and a step of replacing the first subregion with the corresponding figure group.

In the above methods, preferable modes are as follows:

(e) In the fourth aspect, said plurality of subregions further include second subregions, the first subregions are converted into a first figure group composed of a plurality of figures having the complex amplitude transmittance, while having the shape of the mask figure and complex amplitude transmittance, and the second subregions are converted into a second figure group composed of a plurality of figures having the characteristic of the complex amplitude transmittance by way of a step of calculating a near field formed in the vicinity of the mask by light emitted from the first subregions and a step of replacing the near field with a figure group composed of a plurality of figures having the characteristics of complex amplitude transmittance.

(f) In the fifth aspect, the step of calculating a figure group composed of a plurality of figures having the characteristics of the complex amplitude transmittance is to determine the figure group so as to decrease the difference between the diffracted light generated by the near field and second diffracted light generated by the figure group.

(g) In the fourth and fifth aspects, the method further comprises a step of entering in the library the relationship between the subregion and the figure group into which the subregion is converted, a step of determining whether the first subregion has been entered in the library, and a step of converting the first subregion into the figure group on the basis of information on the library.

The following applications can be achieved using the above methods:

(h) A program which estimates an image formed on the substrate by executing the method written in at least any one of the first to fifth aspects on the basis of an external instruction.

(i) A mask pattern design method comprises a step of estimating an image on the basis of the method according to the fourth and fifth aspects, a step of modifying the shape of the figure group or complex amplitude transmittance so as to cause the image to approach a desired image, and a step of modifying the shape of the mask pattern on the basis of the amount of modification.

(j) A semiconductor device manufacturing method of manufacturing devices using a photomask produced using the method in item (i).

As described above, in each of the embodiments, to make an optical proximity effect correction in photolithography, a mask pattern is divided into subregions in a model-based OPC which makes a suitable mask correction for each mask pattern using an optical image intensity simulator, and the model for optical image intensity simulation is changed according to the contents of the pattern in each subregion. Particularly when the minimum dimensions of the mask pattern are smaller than a specific threshold value set near the exposure wavelength, the region and a surrounding region enclosing the region are calculated using a high-accuracy model (3D mask model) and the other regions are calculated using a high-speed model (thin-film mask model).

As described above, whether a 3D mask model or a thin-film mask model is used is determined according to the degree of fineness of the pattern. The 3D mask model is used only for the necessary regions, which not only reduces the OPC load but also manufactures a high-accuracy mask, while suppressing an increase in the mask manufacturing cost and in the manufacturing time, and therefore increases the yield of semiconductor devices sufficiently.

Furthermore, in the third embodiment, a mask pattern is divided into subregions, regions needing calculations using a 3D mask model are extracted, such a thin-film mask as makes a diffracted light distribution at the pupil of the projection lens equivalent to the result of the 3D mask calculation of the original pattern is found, the thin-film mask is replaced with the original mask pattern, and finally an image at the surface of the substrate is calculated for the whole of the modified mask pattern using the thin-film mask model.

Therefore, by reducing the number of precise mask 3D calculations, the time required for OPC can be suppressed, while keeping the accuracy of OPC. Accordingly, an image of a large-area mask pattern can be calculated at high speed with high accuracy.

As described above, according to an aspect of the invention, there is provided a mask pattern correcting method capable of calculating an image of a large-area mask pattern at high speed with high accuracy.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of correcting a mask pattern which is designed to form a semiconductor integrated circuit and is transferred onto a substrate by light exposure, the method comprising:
   dividing, by a computer, the mask pattern into a plurality of subregions;
   determining an optical model to estimate image intensity formed on the substrate from a plurality of optical models on the basis of the relationship between the degree of fineness of the patterns included in each of the subregions and the wavelength of exposure light; and
   estimating image intensity on the substrate for each of said plurality of subregions using the determined optical model, wherein
   the determined optical model is one of a first optical model and a second optical model, the first optical model taking into account an influence of a thickness of the mask, and the second optical model calculating a diffraction of light using a model approximately considering the pattern of the mask to be a two-dimensional object with no thickness;
   said plurality of optical models include high-accuracy optical models and high-speed optical models;
   determining the optical model is to select the high-accuracy optical model if a pattern smaller than a pattern size serving as a threshold value is included in an image intensity calculation region and select the high-speed optical model if the pattern is not included in the image intensity calculation region, and
   after determining the optical model and before estimating image intensity on the substrate, the method further comprises changing to the high-accuracy optical model a subregion arranged so as to enclose a subregion which has selected the high-accuracy optical model in a subregion which has selected the high-speed optical model.

2. The method according to claim 1, wherein the high-accuracy optical models include 3D mask models and the high-speed optical models include thin-film mask models.

3. The method according to claim 1, wherein the pattern size serving as the threshold value is in the range from $\lambda$ to $2\lambda$, if the exposure wavelength is $\lambda$.

4. The method according to claim 1, wherein the exposure light has a wavelength of 193 nm, or the exposure light is EUV light having a wavelength in the range of 10 nm to 15 nm and the mask is a reflection type mask.

5. A method of correcting a mask pattern which is designed to form a semiconductor integrated circuit and is transferred onto a substrate by light exposure, the method comprising:
   dividing, by a computer, the mask pattern into a plurality of subregions;
   determining an optical model to estimate image intensity formed on the substrate from a plurality of optical models on the basis of the relationship between the degree of fineness of the patterns included in each of the subregions and the wavelength of exposure light; and
   estimating image intensity on the substrate for each of said plurality of subregions using the determined optical model, wherein
   the determined optical model is one of a first optical model and a second optical model, the first optical model taking into account an influence of a thickness of the mask, and the second optical model calculating a diffraction of light using a model approximately considering the pattern of the mask to be a two-dimensional object with no thickness;
   said plurality of optical models include high-accuracy optical models and high-speed optical models;
   determining the optical model is to select the high-accuracy optical model if a pattern smaller than a pattern size serving as a threshold value is included in an image intensity calculation region and select the high-speed optical model if the pattern is not included in the image intensity calculation region, and
   after determining the optical model and before estimating image intensity on the substrate, the method further comprises:
   dividing the subregions of the selected high-accuracy optical model into small sub-cells,
   representing at least one of the sub-cells by a high-speed optical model practically equivalent to the result of calculation by a high-accuracy optical model, and
   arranging a plurality of sub-cells including a sub-cell represented by the high-speed optical model to combine the divided subregions.

6. The method according to claim 5, wherein the high-accuracy optical models include 3D mask models and the high-speed optical models include thin-film mask models.

7. The method according to claim 5, wherein the pattern size serving as the threshold value is in the range from $\lambda$ to $2\lambda$, if the exposure wavelength is $\lambda$.

8. The method according to claim 5, wherein the exposure light has a wavelength of 193 nm, or the exposure light is EUV light having a wavelength in the range of 10 nm to 15 nm and the mask is a reflection type mask.

9. A method of correcting a mask pattern which is designed to form a semiconductor integrated circuit and is transferred onto a substrate by light exposure, the method comprising:
dividing, by a computer, the mask pattern into a plurality of subregions;
selecting an optical model to estimate image intensity formed on the substrate from a plurality of optical models differing in accuracy and speed on the basis of the relationship between the smallest size of the patterns included in each of the subregions and the wavelength of exposure light; and
estimating image intensity on the substrate for each of said plurality of subregions using the selected optical model,
wherein, when the smallest size of the patterns included in the subregions is smaller than a specific threshold value, a first optical model, which is a high-accuracy optical model is selected and, when the smallest size is larger than the specific threshold value, a second optical model, which is a high-speed optical model is selected,
wherein, the first optical model takes into account an influence of a thickness of the mask, and the second optical model calculates a diffraction of light using a model approximately considering the pattern of the mask to be a two-dimensional object with no thickness; and
after determining the optical model and before estimating image intensity on the substrate, the method further comprises changing to the high-accuracy optical model a subregion arranged so as to enclose a subregion which has selected the high-accuracy optical model in a subregion which has selected the high-speed optical model.

10. The method according to claim 9, wherein the high-accuracy optical models include 3D mask models and the high-speed optical models include thin-film mask models.

11. The method according to claim 9, wherein the smallest size of the patterns is in the range from $\lambda$ to $2\lambda$, if the exposure wavelength is $\lambda$.

12. A method of correcting a mask pattern which is designed to form a semiconductor integrated circuit and is transferred onto a substrate by light exposure, the method comprising:
dividing, by a computer, the mask pattern into a plurality of subregions;
selecting an optical model to estimate image intensity formed on the substrate from a plurality of optical models differing in accuracy and speed on the basis of the relationship between the smallest size of the patterns included in each of the subregions and the wavelength of exposure light; and
estimating image intensity on the substrate for each of said plurality of subregions using the selected optical model,
wherein, when the smallest size of the patterns included in the subregions is smaller than a specific threshold value, a first optical model, which is a high-accuracy optical model is selected and, when the smallest size is larger than the specific threshold value, a second optical model, which is a high-speed optical model is selected,
wherein, the first optical model takes into account an influence of a thickness of the mask, and the second optical model calculates a diffraction of light using a model approximately considering the pattern of the mask to be a two-dimensional object with no thickness; and
after determining the optical model and before estimating image intensity on the substrate, the method further comprises:
dividing the subregions of the selected high-accuracy optical model into small sub-cells,
representing at least one of the sub-cells by a high-speed optical model practically equivalent to the result of calculation by a high-accuracy optical model, and
arranging a plurality of sub-cells including a sub-cell represented by the high-speed optical model to combine the divided subregions.

13. The method according to claim 12, wherein the high-accuracy optical models include 3D mask models and the high-speed optical models include thin-film mask models.

14. The method according to claim 12, wherein the smallest size of the patterns is in the range from $\lambda$ to $2\lambda$, if the exposure wavelength is $\lambda$.

15. A method of correcting a mask pattern which is designed to form a semiconductor integrated circuit and is transferred onto a substrate by light exposure, the method comprising:
dividing, by a computer, the mask pattern into a plurality of subregions;
selecting a first optical model featuring high accuracy for a subregion where the value obtained by dividing the smallest size of the patterns included in each of the subregions by the wavelength of exposure light is smaller than a specified value and selecting a second optical model featuring high speed for a subregion where the value obtained is equal to or larger than the specified value; and
estimating image intensity for each of said plurality of subregions using the selected first or second optical model,
wherein, the first optical model takes into account an influence of a thickness of the mask, and the second optical model calculates a diffraction of light using a model approximately considering the pattern of the mask to be a two-dimensional object with no thickness; and
after selecting the optical model and before estimating the image intensity, the method further comprises changing a subregion which has selected the second optical model to a subregion which uses the first optical model within a specified distance from a subregion which has selected the first optical model.

16. The method according to claim 15, wherein the first optical model is a model which takes into account the influence of the thickness of the mask in estimating the diffraction of light on the mask.

17. The method according to claim 15, wherein the first optical model is a model which takes into account a change in the diffracted light depending on the incident angle of light in estimating the diffraction of light on the mask.

18. The method according to claim 15, wherein the first optical models include 3D mask models and the second optical models include thin-film mask models.

19. A semiconductor device manufacturing method of forming a photomask using the mask pattern correcting method according to claim 15 and manufacturing semiconductor devices using the photomask.

20. A method of correcting a mask pattern which is designed to form a semiconductor integrated circuit and is transferred onto a substrate by light exposure, the method comprising:

dividing, by a computer, the mask pattern into a plurality of subregions;

selecting a first optical model featuring high accuracy for a subregion where the value obtained by dividing the smallest size of the patterns included in each of the subregions by the wavelength of exposure light is smaller than a specified value and selecting a second optical model featuring high speed for a subregion where the value obtained is equal to or larger than the specified value; and estimating image intensity for each of said plurality of subregions using the selected first or second optical model, wherein, the first optical model takes into account an influence of a thickness of the mask, and the second optical model calculates a diffraction of light using a model approximately considering the pattern of the mask to be a two-dimensional object with no thickness, and after determining the optical model and before estimating image intensity on the substrate, the method further comprises:

dividing the subregion which has selected the first optical model into small sub-cells, representing at least one of the sub-cells by a second optical model practically equivalent to the result of calculation by the first optical model, and arranging a plurality of sub-cells including a sub-cell represented by the second optical model to compose a subregion divided into the sub-cells.

21. The method according to claim 20, wherein the first optical model is a model which takes into account the influence of the thickness of the mask in estimating the diffraction of light on the mask.

22. The method according to claim 20, wherein the first optical model is a model which takes into account a change in the diffracted light depending on the incident angle of light in estimating the diffraction of light on the mask.

23. The method according to claim 20, wherein the first optical models include 3D mask models and the second optical models include thin-film mask models.

24. A semiconductor device manufacturing method of forming a photomask using the mask pattern correcting method according to claim 20 and manufacturing semiconductor devices using the photomask.

* * * * *